United States Patent
Maekawa et al.

(10) Patent No.: US 6,784,759 B2
(45) Date of Patent: Aug. 31, 2004

(54) ANTENNA DUPLEXER AND COMMUNICATION APPARATUS

(75) Inventors: Tomoya Maekawa, Katano (JP); Hiroyuki Nakamura, Katano (JP); Toru Yamada, Katano (JP); Toshio Ishizaki, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/202,799

(22) Filed: Jul. 25, 2002

(65) Prior Publication Data

US 2003/0025572 A1 Feb. 6, 2003

(30) Foreign Application Priority Data

Jul. 27, 2001 (JP) .......................................... 2001-228300

(51) Int. Cl.[7] ................................................. H03H 7/46
(52) U.S. Cl. ......................... 333/132; 333/185; 333/193
(58) Field of Search .............................. 333/132, 133, 333/134, 185, 193

(56) References Cited

U.S. PATENT DOCUMENTS

| | | | |
|---|---|---|---|
| 5,515,015 A | 5/1996 | Nakata | 333/132 |
| 5,525,942 A * | 6/1996 | Horii et al. | 333/134 |
| 5,719,539 A | 2/1998 | Ishizaki et al. | 333/204 |
| 6,020,799 A | 2/2000 | Ishizaki et al. | 333/204 |
| 6,308,051 B1 * | 10/2001 | Atokawa | 455/78 |
| 6,456,172 B1 * | 9/2002 | Ishizaki et al. | 333/133 |
| 6,525,626 B2 * | 2/2003 | Mandai et al. | 333/134 |
| 6,531,933 B2 * | 3/2003 | Miyamoto et al. | 333/133 |

FOREIGN PATENT DOCUMENTS

| | | | |
|---|---|---|---|
| EP | 1094 538 A2 | 4/2001 | H01P/1/203 |
| JP | 2-211701 | 8/1990 | H01P/1/213 |
| JP | 6-6111 | 1/1994 | H01P/1/213 |
| JP | 6-112735 | 4/1994 | H01P/1/20 |
| JP | 7-312503 | 11/1995 | H01P/1/203 |
| JP | 2001-189605 | 7/2001 | H01P/1/213 |

* cited by examiner

Primary Examiner—Robert Pascal
Assistant Examiner—Dean Takaoka
(74) Attorney, Agent, or Firm—RatnerPrestia

(57) ABSTRACT

An antenna duplexer has
- a receiving filter having a surface acoustic wave device;
- a transmitting filter having a dielectric resonator; and
- a matching circuit for matching the receiving filter and the transmitting filter with an antenna respectively,
- wherein the transmitting filter, receiving filter, and matching circuit are integrated with each other.

28 Claims, 15 Drawing Sheets

Fig. 6 (A)

| COMPOSITION FORMULA | RELATIVE DIELECTRIC CONSTANT | BENDING STRENGTH |
|---|---|---|
| $Bi_2O_3$-$CaO$-$Nb_2O_5$ | 58 | 120 Mpa |
| $BaO$-$TiO_2$-$Nd_2O_3$-GLASS | 70 | APPROX. 120 Mpa |

Fig. 6 (B)

| COMPOSITION FORMULA | RELATIVE DIELECTRIC CONSTANT | BENDING STRENGTH |
|---|---|---|
| $MgO$-$SiO_2$-GLASS | 7.2 | 150 Mpa |
| $Al_2O_3$-$Gd_2O_3$-$MgO$-$SiO_2$-GLASS | 7.5 | 230 Mpa |
| $Al_2O_3$-GLASS | 7~8 | 200~250 Mpa |

Fig. 6 (C)

| COMPOSITION FORMULA | RELATIVE DIELECTRIC CONSTANT | BENDING STRENGTH |
|---|---|---|
| $ZrO_2$-$TiO_2$-$MgO$-$Nb_2O_5$ | 43 | APPROX. 220 Mpa |
| $BaO$-$TiO_2$-$Nd_2O_3$ | 90 | 140~160 Mpa |
| $BaO$-$TiO_2$-$Sm_2O_3$ | 70~80 | 140~160 Mpa |

ANTENNA DUPLEXER AND COMMUNICATION APPARATUS

BACKGROUND OF THE INVENTION

1. Field of the Invention

The present invention relates to an antenna duplexer and a communication apparatus used in radio devices such as mobile communication devices.

2. Description of the Related Art

Antenna duplexers are high-frequency devices used in radio devices such as mobile phones for separating transmit waves from receive waves. As mobile phones have become smaller and more powerful, there has emerged a need for further reduction in size and improvement in performance of the antenna duplexers.

A typical antenna duplexer includes a receiving filter, a transmitting filter, and a matching circuit. A transmit wave is provided from a transmitter circuit to the matching circuit through the transmitting filter, subjected to matching in the matching circuit, and then guided to the antenna. A receive wave is provided from the antenna to the matching circuit, subjected to matching there, and then guided to a receiver circuit through the receiving filter.

FIG. 15 shows a perspective view of a first antenna duplexer according to the prior art. The first antenna duplexer uses a SAW (Surface Acoustic Wave) filter as a transmitting filter 50. The duplexer uses as a receiving filter 52 a dielectric coaxial filter having a coaxial resonator. The transmitting filter 50 and the receiving filter 52 are implemented on a circuit board 53.

Because the transmitting filter 50 used is the small SAW filter and the receiving filter 52 is the dielectric coaxial filter having the coaxial resonator, which provides a high Q-value and small insertion loss, the first antenna duplexer exhibits a sufficiently small insertion loss in receive waves and improved spectral separation and has a reduced size in its entirety.

FIG. 16 shows a perspective view of a second antenna duplexer according to the prior art. In the second antenna duplexer, a dielectric coaxial filter having a coaxial resonator is used as its transmitting filter 54 and a SAW filter is used as its receiving filter 55. The transmitting filter 54 and the receiving filter 55 are implemented on a circuit board 56. A matching circuit is implemented by a transmission line provided on the circuit board 56.

Because the SAW filter, which is small and light, is used as the receiving filter 55, the entire size of second antenna duplexer is small.

However, the first antenna duplexer has the separate transmitting filter 50 and receiving filter 52 provided on the circuit board 53. In addition, the dielectric coaxial filter used as the receiving filter 52 is typically large in size. The separate transmitting filter 50 and receiving filter 52 provided on the circuit board 53 and the large size of receiving filter 52 prevent the first antenna duplexer from being further reduced in size.

The second antenna duplexer separately mounts the transmitting filter 54 and the receiving filter 55 provided on the circuit board 53 and uses the dielectric coaxial filter as the transmitting filter 54. And, the dielectric coaxial filter is typically large. Like this, the second antenna duplexer is provided with such a constitution that the transmitting filter 54 and the receiving filter 55 are separately mounted on the circuit board 53, and the transmitting filter 54 is large, and furthermore a transmission line used as a matching circuit is wired on the circuit board, thereby preventing the second antenna duplexer from being further reduced in size.

The prior-art antenna duplexers have the problem that the transmitting and receiving filters separately provided on their circuit boards make it difficult to further reduce their size.

Furthermore, in the case when the dielectric coaxial filters are used the large sizes of dielectric coaxial filters used in the prior-art antenna duplexers make it more difficult to reduce the size of the duplexers.

Another problem with the prior-art antenna duplexers is that because the transmitting and receiving filters are separately provided on the circuit board, they have a large number of components and are therefore costly. Also, it is difficult to improve their reliability and stability.

SUMMARY OF THE INVENTION

In view of these problems, an object of the present invention is to provide a smaller antenna duplexer and communication apparatus that have higher antenna duplexer electric properties.

Furthermore, in view of these problems, another object of the present invention is to provide an antenna duplexer and communication apparatus that have higher antenna duplexer electric properties and improved reliability and stability.

One aspect of the present invention is an antenna duplexer comprising:

a receiving filter having a surface acoustic wave device;

a transmitting filter having a dielectric resonator; and a matching circuit for matching said receiving filter and said transmitting filter with an antenna respectively, wherein said transmitting filter, receiving filter, and matching circuit are integrated with each other.

Another aspect of the present invention is the antenna duplexer, wherein said matching circuit has a dielectric multilayer structure.

Still another aspect of the present invention is the antenna duplexer, wherein said transmitting filter and said matching circuit are integrated as a dielectric multilayer structure.

Yet still another aspect of the present invention is the antenna duplexer, wherein a dielectric constant of a dielectric material forming said transmitting filter is different from a dielectric constant of a dielectric material forming said matching circuit.

Still yet another aspect of the present invention is the antenna duplexer, wherein the dielectric constant of the dielectric material forming said transmitting filter is higher than the dielectric constant of the dielectric material forming said matching circuit.

A further aspect of the present invention is the antenna duplexer, wherein a relative dielectric constant of the dielectric material forming said transmitting filter is equal to or higher than 10.

A still further aspect of the present invention is the antenna duplexer, wherein the relative dielectric constant of the dielectric material forming said matching circuit is less than 10.

A yet further aspect of the present invention is the antenna duplexer, comprising a layer formed of the same material as the dielectric material forming said matching circuit, wherein said transmitting filter is sandwiched between said matching circuit and said layer to form one integrated multilayer structure.

A still yet further aspect of the present invention is the antenna duplexer, wherein said receiving filter is formed on top of or under said matching circuit and encapsulated in a resin, and said receiving filter is electrically connected with said matching circuit.

An additional aspect of the present invention is the antenna duplexer, wherein said matching circuit is formed on top of or under said transmitting filter, and said receiving filter is electrically connected with said matching circuit.

A still additional aspect of the present invention is the antenna duplexer, wherein said matching circuit is formed on a side on which said receiving filter is formed, and said receiving filter is electrically connected with said matching circuit.

A yet additional aspect of the present invention is the antenna duplexer, wherein said receiving filter is formed adjacent to said transmitting filter in said matching circuit and encapsulated in a resin, and the receiving filter and the transmitting filter are electrically connected with the matching circuit, respectively.

A still yet additional aspect of the present invention is the antenna duplexer, wherein said receiving filter is formed in said matching circuit and encapsulated in a resin.

A supplementary aspect of te present invention is the antenna duplexer, wherein said transmitting filter and said matching circuit are connected through an edge electrode and/or a via electrode.

A still supplementary aspect of the present invention is the antenna duplexer, wherein said matching circuit has a stripline; and
   said receiving filter is connected to said stripline through a via and is connected through electromagnetic coupling to a stripline leading from said antenna.

A yet supplementary aspect of the present invention is the antenna duplexer, wherein said matching circuit has a stripline; and
   said transmitting filter is connected to said stripline through a via and is connected through electromagnetic coupling to said a stripline leading from said antenna.

A still yet supplementary aspect of the present invention is an antenna duplexer comprising:
   a receiving filter having a composite structure of a filter having a surface acoustic wave device and a filter having a dielectric resonator;
   a transmitting filter having a filter with a dielectric resonator; and
   a matching circuit for matching said receiving filter and said transmitting filter with an antenna,
   wherein said receiving filter, transmitting filter, and matching filter are integrated with each other.

Another aspect of the present invention is a communication apparatus comprising:
   an antenna duplexer;
   a transmitter circuit for outputting a transmit wave to said transmitting filter; and
   a receiver circuit for inputting a receive signal provided from said receiving filter.

Still another aspect of the present invention is a communication apparatus comprising:
   an antenna duplexer;
   a transmitter circuit for outputting a transmit wave to said transmitting filter; and
   a receiver circuit for inputting a receive signal provided from said receiving filter.

BRIEF DESCRIPTION OF THE DRAWINGS

FIG. 6A shows examples of a high-dielectric-constant low-temperature-co-fired ceramic according to the first through third embodiments of the present invention;

FIG. 6B shows examples of a low-dielectric-constant low-temperature-co-fired ceramic according to the first through third embodiments of the present invention;

FIG. 6C shows examples of a high-dielectric-constant high-temperature-co-fired ceramic according to the first through third embodiments of the present invention;

DESCRIPTION OF SYMBOLS

Figure 1:
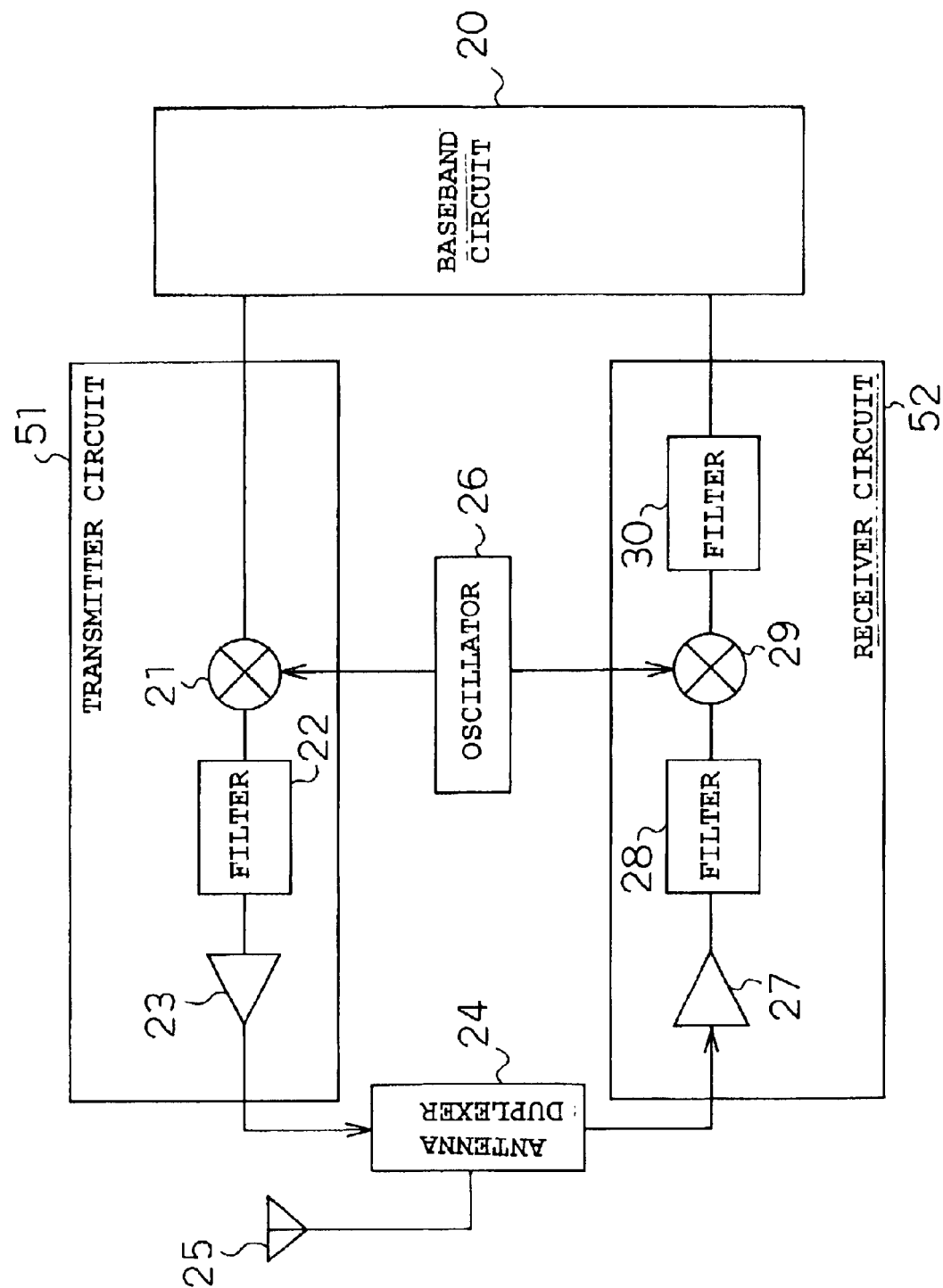
FIG. 1 shows a block diagram of a configuration of a communication apparatus according to first through third embodiments of the present invention.

1 SAW filter
2 Encapsulation resin
3 First LTCC
4 Stripline resonator
5 LGA electrode
6 Second LTCC
7 Third LTCC
8 Inter-layer via hole
9 Bump
10 Internal conductor
11 Edge electrode
12 Resin
13a, 13b HTC
14 Metal foil
24 Antenna duplexer

DETAILED DESCRIPTION OF THE PREFERRED EMBODIMENTS

Embodiments of the present invention will be described below with reference to the accompanying drawings.

(First Embodiment)

A first embodiment will be described below.

FIG. 1 shows a block diagram of a radio section of a communication apparatus using an antenna duplexer 24 according to the first embodiment. The communication apparatus according to the first embodiment may be a mobile phone, for example.

The communication apparatus of the first embodiment provides communications using a simultaneous transmission and reception technology such as the CDMA, in which sending and receiving are performed at the same time. The antenna duplexer 24 of the first embodiment is used in a communication apparatus that uses a simultaneous transmission and reception technology such as the CDMA to perform communications.

The communication apparatus includes a baseband circuit 20, frequency converter 21, filter 22, power amplifier 23, antenna duplexer 24, antenna 25, oscillator 26, low-noise amplifier 27, filter 28, frequency converter 29, and filter 30.

The power amplifier 23, filter 22, and frequency converter 21 constitute a transmitter circuit 51. The low-noise amplifier 27, filter 28, frequency converter 29, and filter 30 constitute a receiver circuit 52.

The baseband circuit 20 modulates a signal with a baseband signal and outputs the modulated signal to be sent. It demodulates a received modulated signal into a baseband signal.

The frequency converter 21 converts a modulated signal into a signal of a transmit frequency.

The filter 22 reduces unwanted frequency components of a signal of a transmit frequency provided from the frequency converter 21.

The power amplifier 23 amplifies a signal from which unwanted frequency components are reduced.

The antenna duplexer 24 separates a transmit wave from a receive wave.

The antenna 25 transmits a transmit signal as a transmit wave and receives a receive wave as a receive signal.

The oscillator 26 oscillates a high-frequency signal used for converting a modulated signal into a signal of the transmit frequency in the frequency converter 21. It oscillates a high-frequency signal used for converting a received signal of a receive frequency into a signal of a frequency for outputting it to the baseband circuit 20.

The low-noise amplifier 27 amplifies a received signal with low noise.

The filter 28 reduces unwanted frequency components of a signal provided from the low-noise amplifier 27.

The frequency converter 29 converts a signal provided from the filter 28 into a signal of a frequency for outputting to the baseband circuit 20.

The filter 30 reduces unwanted frequency components of a signal frequency-converted by the frequency converter 29.

Operation of the radio communication apparatus of the present embodiment will be described below.

The baseband circuit 20 modulates a signal with a baseband signal, which is an audio signal inputted through an input device, such as a microphone, and outputs a modulated signal. The frequency converter 21 combines the modulated signal with a carrier signal inputted from the oscillator 26 to convert the modulated signal into a signal of a transmit frequency. Then, the filter 22 reduces unwanted frequency components of the signal of the transmit frequency. The power amplifier 23 amplifies the signal outputted from the filter 22 and outputs it as a transmit signal. Then, the antenna duplexer 24 guides the transmit signal to the antenna 25. The transmit signal is sent out as a transmit wave from the antenna 25 by air.

The antenna 25 receives a receive wave and the antenna duplexer 24 guides the receive signal received at the antenna 25 to the low-noise amplifier 27. The low-noise amplifier 27 amplifies the received signal and the filter 28 reduces unwanted frequency components of the signal outputted from the low-noise amplifier 27. The frequency converter 29 combines the signal outputted from the filter 28 with a signal provided from the oscillator 26 to convert it into a signal of a frequency for the baseband circuit 20. The filter 30 reduces unwanted frequency components of the signal frequency-converted signal. The baseband circuit 20 demodulates the signal outputted from the filter 30. The demodulated signal is outputted as sound through a speaker. Up to this point, the operation of the radio communication apparatus has been described.

The antenna duplexer 24 used in the radio communication apparatus will be described below.

Figure 2:
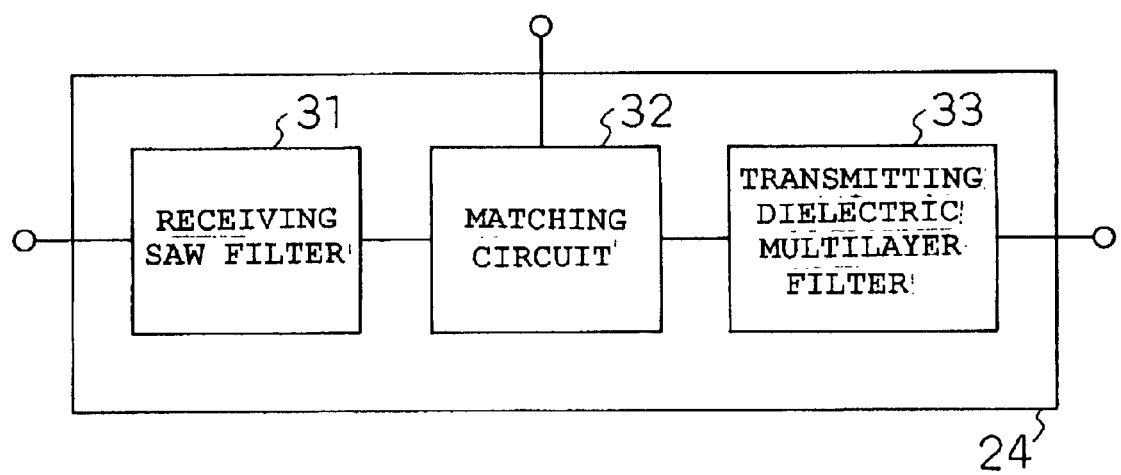
FIG. 2 shows a block diagram of a configuration of an antenna duplexer according to the first through third embodiments of the present invention.

FIG. 2 shows a circuit configuration of the antenna duplexer 24 of the first embodiment.

The antenna duplexer 24 includes a receiving SAW filter 31, matching circuit 32, and transmitting dielectric multilayer filter 33.

The receiving SAW filter 31 is a SAW (Surface Acoustic Wave) filter for guiding a receive wave received at the antenna 25 to the low-noise amplifier 27 in the receiver circuit. The SAW filter applies an RF signal to a comb electrode formed on a piezoelectric substrate to convert an electric signal into strain energy and to cause it to propagate as a surface acoustic wave. An output comb electrode converts the strain energy into an electric signal to select an RF signal of a certain frequency.

The transmitting dielectric multilayer filter 33 guides a transmit signal provided from the power amplifier 23 in the transmitter circuit to the antenna 25.

The matching circuit 32 matches the antenna 25 with the receiving SAW filter 31 and also matches the antenna 25 with the transmitting dielectric multilayer filter 33.

Figure 3:
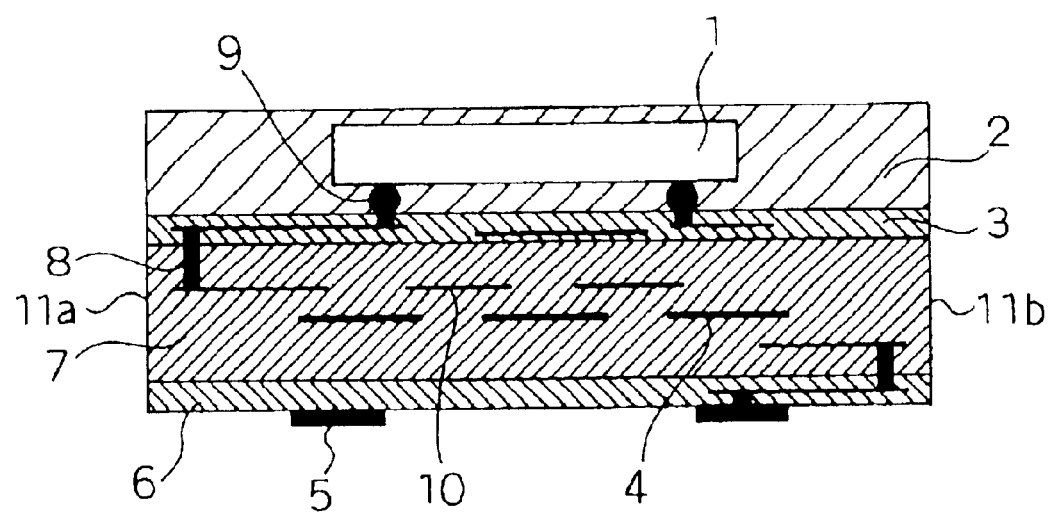
FIG. 3 shows a cross-sectional view showing a structure of the antenna duplexer according to the first embodiment of the present invention.

FIG. 3 shows a cross-sectional view of the antenna duplicator 24.

The antenna duplicator 24 has an integrated structure of a dielectric multilayer section and a SAW filter section, as shown in FIG. 3.

The matching circuit 32 is formed by a combination of a lumped-constant inductor and capacitor in a first LTCC (Low Temperature Co-fired Ceramic) 3 layer shown in FIG. 3. The receiving SAW filter 31 is provided as a SAW filter 1 on the top surface of the first LTCC 3 and encapsulated in an encapsulation resin 2. A third LTCC 7 is formed under the first LTCC 3 and the transmitting dielectric multilayer filter 33 is formed by a multilayer structure. Provided inside the layered structure of the third LTCC 7 are main components of the transmitting dielectric multilayer filter 33, such as stripline resonators 4 and internal conductors 10 forming capacitors. A second LTCC 6 is formed under the third LTCC 7 and an LGA (Land Grid Array) electrode 5 is formed under the second LTCC 6. Edge electrodes 11a and 11b are provided on either side of the third LTCC 7.

Figure 4:
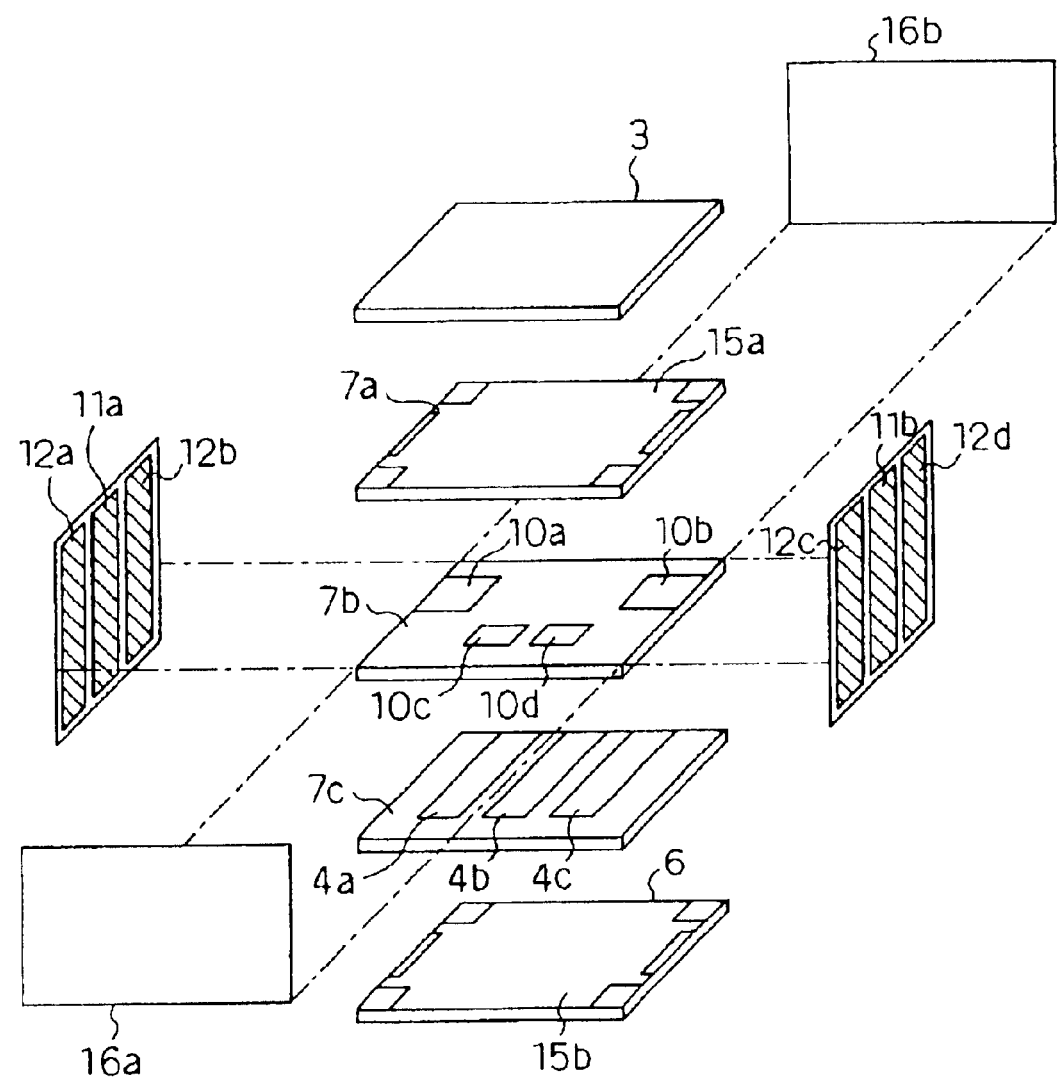
FIG. 4 shows an exploded perspective view of an example of a multilayer structure of a part including a transmitting dielectric multilayer filter and a matching circuit of the antenna duplexer according to the first embodiment of the present invention.

FIG. 4 shows an exploded perspective view illustrating an example of the multilayer structure of the first LTCC 3, second LTCC 6, and third LTCC 7 of the antenna duplexer 24, that is, the multilayer structure of the matching circuit 32 and transmitting dielectric multilayer filter 33.

As shown in FIG. 4, the third LTCC 7 layer is a structure in which substrates 7a, 7b, and 7c of the third LTTC are stacked in order. The first LTCC 3 is provided on top of the third LTCC 7 layer. The second LTCC 6 is provided under the third LTCC 7 layer.

Stripline resonators 4a to 4c are provided on the top surface of the third LTTC substrate 7c. Provided on the top surface of the third LTTC substrate 7b are input/output coupling capacitor electrodes 10a and 10b and inter-stage coupling capacitor electrodes 10c and 10d. A shield electrode 15a is provided on the top surface of the third LTCC substrate 7a and another shield electrode 15b is provided on the top surface the second LTCC substrate 6. The matching circuit 32 is connected with the transmitting dielectric multilayer filter 33 through edge electrodes 12a through 12d or via electrodes, for example, which connection is not shown in FIG. 4.

The second LTCC substrate 6 in this embodiment is an example of a layer of the present invention.

Operation of the antenna duplexer 24 according to this embodiment will be described below.

First, operation of the transmitting dielectric multilayer filter 33 will be described.

Figure 5:
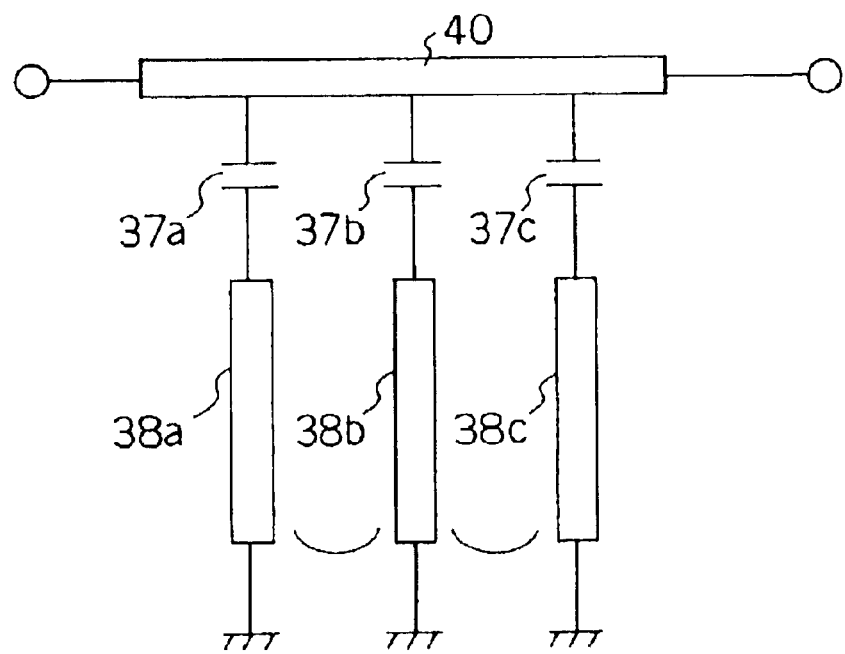
FIG. 5A shows an equivalent circuit of the transmitting dielectric multilayer filter according to the first through third embodiments of the present invention, implemented by a band elimination filter.
FIG. 5B shows an equivalent circuit of the transmitting dielectric multilayer filter according to the first through third embodiments of the present invention, implemented by a band pass filter.
Figure 5:
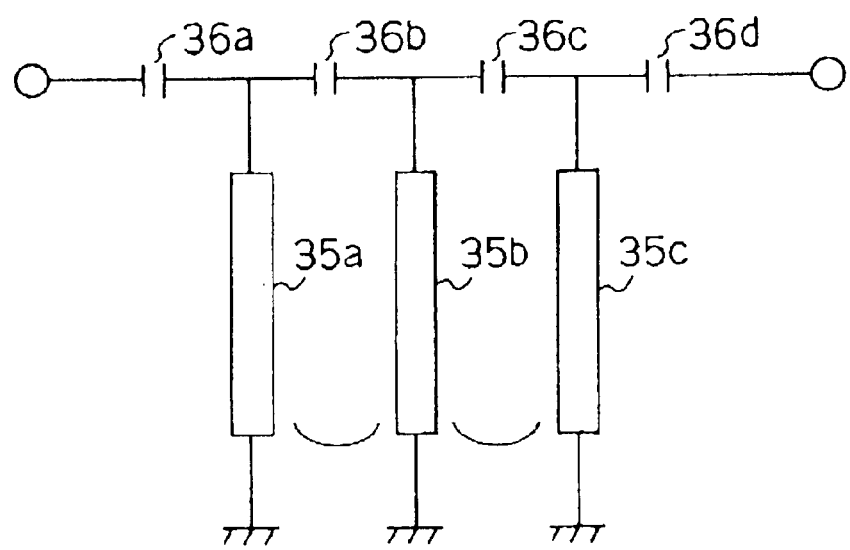

FIG. 5 shows an example of a circuit of a part of the transmitting dielectric multilayer filter 33. FIG. 5A shows an example of a circuit of the transmitting dielectric multilayer filter 33, which is a BEF (Band Elimination Filter) FIG. 5B shows an example of a circuit of the transmitting dielectric multilayer filter 33, which is a BPF (Band Pass Filter). The exploded perspective view in FIG. 4 corresponds to the transmitting dielectric multilayer filter 33 implemented by the band pass filter, that is, the circuit in FIG. 5B.

In FIG. 5A, one end of each of stripline resonators 38a, 38b, and 38c is connected to a transmission line 40 through capacitors 37a, 37b, and 37c and the other end of each of the stripline resonators 38a, 38b, and 38c is grounded. Thus, the transmitting dielectric multilayer filter 33 can function as a band elimination filter consisting of three resonators, for example. The stripline resonator 4 formed in the third LTCC 7 operates as quarter-wavelength stripline resonators 38a, 38b, and 38c and the internal conductor 10 operates as capacitors 37a, 37b, and 37c.

As shown in FIG. 5B, the transmitting dielectric multilayer filter 33 can also be configured as a band pass filter. In FIG. 5B, one end of each of stripline resonators 35a, 35b, and 35c is grounded and the other end is capacitive coupled through input/output coupling capacitors 36a and 36d, and inter-stage coupling capacitors 36b and 36c. The stripline resonators 35a, 35b, and 35c correspond to stripline resonators 4a, 4b, and 4c, respectively, shown in FIG. 4. The input/output coupling capacitors 36a and 36d correspond to the input/output coupling capacitor electrodes 10a and 10b, respectively, shown in FIG. 4. The inter-stage coupling capacitors 36b and 36c correspond to the inter-stage copuling capacitor electrodes 10c and 10d, respectively, shown in FIG. 5.

The third LTCC 7 constituting the transmitting dielectric multilayer filter 33 is made of a high-dielectric-constant low-temperature-co-fired ceramic having a relative dielectric constant of 10 or higher, preferably between approximately 40 and 60.

FIG. 6A shows an example of such a high-dielectric-constant low-temperature-co-fired ceramic. A high-dielectric-constant low-temperature-co-fired ceramic such as $Bi_2$—$O_3$—$Nb_2O_5$ or $BaO$—$TiO_2$—$Nd_2O_3$-glass is used to form the third LTCC 7. As shown in FIG. 6A, $BiO_2$—$CaO$—$Nb_2O_5$ has a relative dielectric constant of 58 and $BaO$—$TiO_2$—$Nd_2O_3$-glass has a relative dielectric constant of 70. A smaller quarter-wavelength stripline resonator 4 can be formed by using such a high-dielectric-constant low-temperature-co-fired ceramic. Furthermore, it is effective in decreasing loss by the transmitting dielectric multilayer filter 33 if a band elimination filter, which is effective in decreasing losses compared with a bandpass filter, is formed as the transmitting dielectric multilayer filter 33 in the third LTCC 7. Thus, the transmitting dielectric multilayer filter 33 that exhibits a lower transmit signal loss in the pass band can be provided. In addition, the high-dielectric-constant low-temperature-co-fired ceramic used for the third LTCC 7 allows the transmitting dielectric multilayer filter 33 to be reduced in size.

The second LTCC 6 is formed of low dielectric constant LTCC.

FIG. 6B shows an example of low-dielectric-constant low-temperature-co-fired ceramic. A low-dielectric-constant low-temperature-co-fired ceramic such as $MgO$—$SiO_2$-glass (having a relative dielectric constant of 7.2), $Al_2O_3$—$Gd_2O_3$—$MgO$—$SiO_2$-glass (having a relative dielectric constant of 7.5), or $Al_2O_3$-glass (having a relative dielectric constant of 7 to 8) is used to make the second LTCC 6. Low-dielectric-constant low-temperature-co-fired ceramics typically have a higher bending strength as compared with that of the high-dielectric-constant low-temperature-co-fired ceramics. For example, the low-dielectric-constant low-temperature-co-fired ceramics shown in FIG. 6B have higher transverse intensities than those of the high-dielectric-constant low-temperature-co-fired ceramics shown in FIG. 6A. Thus, even though the LGA electrode 5 is used, the device having a high terminal electrode strength can be provided by disposing the second LTCC 6 having such a high bending strength at the bottom of the transmitting dielectric multilayer filter 33. In addition, the first LTCC 3 layer in which the matching circuit 32 is formed is also made of a low-dielectric-constant LTCC having a high bending strength, like the second LTCC 6. Thus, sandwiching the third LTCC 7 of the transmitting dielectric multilayer filter 33 in between the first LTCC 3 and second LTCC 6 made of similar high-transverse-intensity materials can prevent warpage of the layers due to a difference in coefficient of expansion of the layers during co-firing. This also can provide transmitting dielectric multilayer filter 33 that is resistant to impacts such as drop impacts, and has high stability and reliability.

Preferably, the LTCC 7 is made of a high-dielectric constant low-temperature-co-fired ceramic having a relative dielectric constant of 10 or higher and the LTCC 3 and LTCC 6 are made of a low-dielectric-constant low-temperature-co-fired ceramic having a relative dielectric constant of less than 10.

Operation of the receiving SAW filter 31 will be described below.

The receiving SAW filter 31 can provide high attenuation near the pass band. In addition, its size can be significantly reduced compared with dielectric multilayer filters or dielectric coaxial filters.

The SAW filter used as the receiving SAW filter 31 can provide a balance at the front end.

Operation of the matching circuit 32 will be described below.

The matching circuit 32 is a combination of a lumped-constant inductor and capacitor formed in the first LTCC 3. The first LTCC 3 in which the matching circuit 32 is formed is made of a low-dielectric-constant LTCC having a high bending strength like the second LTCC 6, as described above. In order for the antenna duplexer 32 to function, a stripline having a characteristic impedance of 50 ohms must be provided in the matching circuit 32, which is provided between the receiving SAW filter 31 and the transmitting dielectric multilayer filter 33.

Typically, low-dielectric-constant materials facilitate the fabrication of inductors compared with high-dielectric-constant materials. For example, in order to form a stripline having a characteristic impedance of 50 ohms by using a low-dielectric-constant material, the line-width of the stripline should be approximately 100 $\mu$m. Such a stripline can easily be formed by a process. In contrast, in order to form a stripline having a characteristic impedance of 50 ohms by using a high-dielectric-constant material, the line-width of the stripline should be several micrometers. It is very difficult to form the stripline having a line-width of as small as several micrometers by any process.

As is clear from the above description, in order to form a stripline having a characteristic impedance of 50 ohms, it is desirable that the relative dielectric constant of the matching circuit 32 be less than 10.

Forming the first LTCC 3 of a low-dielectric-constant material facilitates the fabrication of the stripline having a characteristic impedance of 50 ohms or higher. In addition, because the electromagnetic coupling between adjacent striplines is relatively small, interference between devices can be minimized. Furthermore, because the stripline having a characteristic impedance of 50 ohms or higher can easily be formed, matching with the receiving SAW filter 31 can easily be provided.

For implementing the transmitting dielectric multilayer filter 33, it is desirable that the bending strength of the first LTCC 3 be high. As described above, the first LTCC 3 is made of a low-dielectric-constant material having a high bending strength. As shown in FIG. 6, the first LTCC 3 has a bending strength equivalent to or two or more times higher than that of a high-dielectric-constant material. This also improves the reliability of the receiving SAW filter 31 during its implementation.

If heterogeneous layering techniques are used to form the transmitting dielectric multilayer filter 33 of a high dielectric-constant LTCC in order to reduce its size, the inductor can be easily formed because the matching circuit 32 can be formed of a low-dielectric-constant LTCC. The matching circuit 32 is integrated as one multilayer structure with the transmitting dielectric multilayer filter 33. This also facilitates reduction of the size of the antenna duplexer.

While the matching circuit is formed by the inductor and capacitor using a low-dielectric-constant low-temperature-co-fired ceramic in the present embodiment, the matching circuit may be formed by a transmission lines to obtain similar effects to those described above.

A method of manufacturing the antenna duplexer 24 will be described below.

Figure 7:
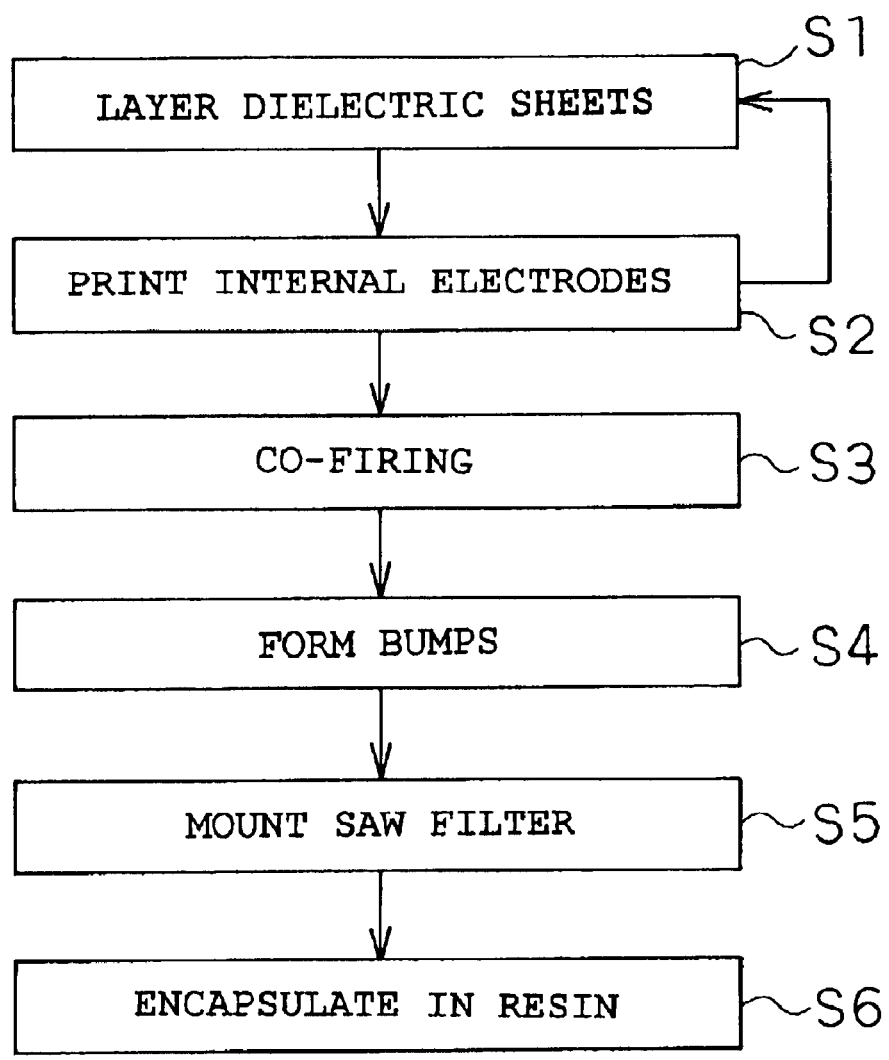
FIG. 7 shows a flowchart of a method of manufacturing the antenna duplexer according to the first embodiment of the present invention.
Figure 8:
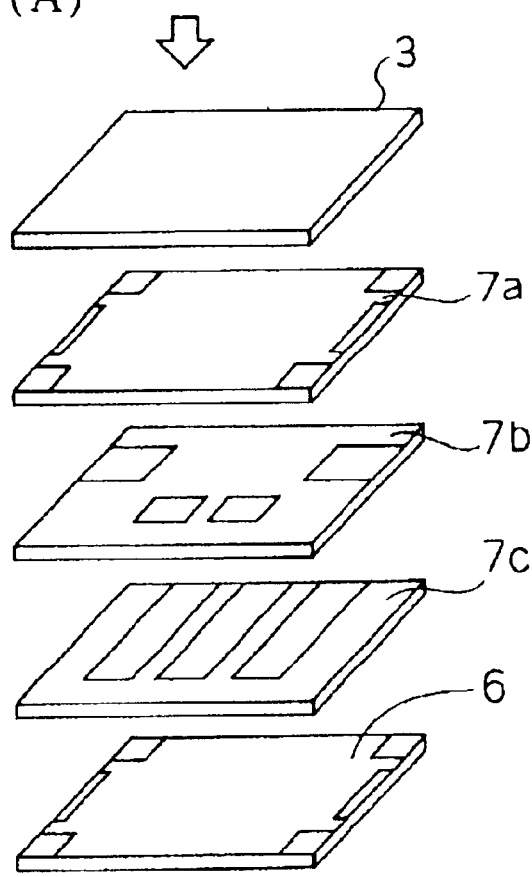
FIG. 8A shows an essential step of the method of manufacturing the antenna duplexer according to the first embodiment of the present invention, depicting dielectric sheets to be layered.
FIG. 8B shows an essential step of the method of manufacturing the antenna duplexer according to the first embodiment of the present invention, depicting a multilayer structure before being co-fired.
FIG. 8C shows an essential step of the method of manufacturing the antenna duplexer according to the first embodiment of the present invention, depicting the dielectric multilayer structure on which bumps are formed.
FIG. 8D shows an essential step of the method of manufacturing the antenna duplexer according to the first embodiment of the present invention, depicting the dielectric multilayer structure on which a SAW filter is mounted.
FIG. 8E shows an essential step of the method of manufacturing the antenna duplexer according to the first embodiment of the present invention, depicting the SAW filter encapsulated in a resin.
Figure 8:
Figure 8:
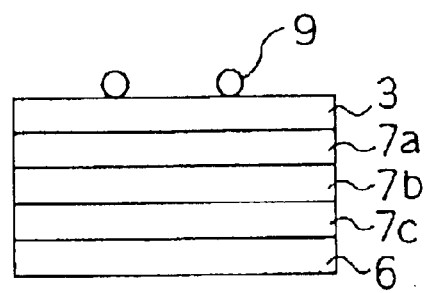
Figure 8:
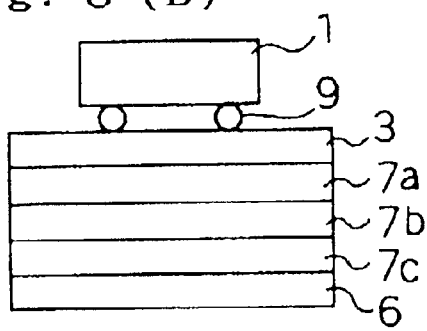
Figure 8:
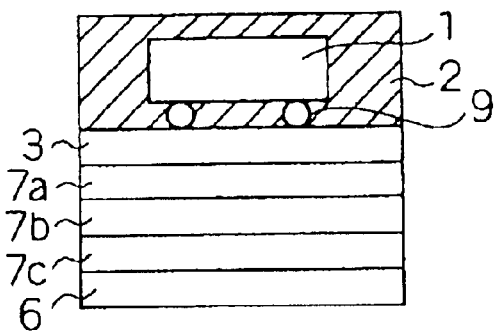

FIG. 7 shows a flowchart of a method of manufacturing the antenna duplexer 24. FIG. 8 shows essential steps of the method of manufacturing the antenna duplexer 24.

First, dielectric sheets of a dielectric multilayer structure consisting of the second LTCC 6, third LTCC 7, and first LTCC 3 are layered under pressure as shown in FIG. 8A (S1). Then, internal electrodes are printed on the stack dielectric sheets (S2). FIG. 8B shows the structure resulting from the layering under pressure.

The structure shown in FIG. 8B is co-fired (S3), then bumps 9 are formed on the co-fired dielectric multilayer structure as shown in FIG. 8C (S4). Then, a SAW filter 1 is mounted as shown in FIG. 8D (S5). Finally, the SAW filter 1 is encapsulated in a resin 2 (S6) to complete the antenna duplexer 24 as shown in FIG. 8E.

In this way, the matching circuit 32 and transmitting dielectric multilayer filter 33 are formed as an integrated dielectric multilayer structure by co-firing them.

(Second Embodiment)

A second embodiment of the present invention will be described below.

Figure 9:
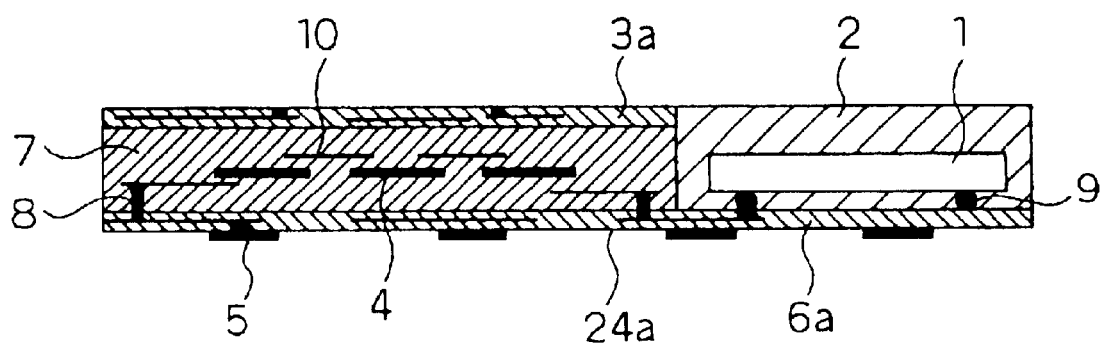
FIG. 9 is a cross-sectional view showing a structure of an antenna duplexer according to the second embodiment of the present invention.

FIG. 9 shows a cross-sectional view of an antenna duplexer 24a according to a second embodiment. The same elements as those in the first embodiment are labeled with the same reference numerals and the detailed description of which will be omitted.

The second embodiment differs from the first embodiment in that matching circuits 32 are formed inside a first LTCC 3a and a second LTCC 6a. Both of the first LTCC 3a and second LTCC 6a are made of low-dielectric-constant materials.

A transmitting dielectric multilayer filter 33 is formed in a third LTTC 7 as in the first embodiment.

The third LTCC 7 is formed as the transmitting dielectric multilayer filter 33 on the top surface of the second LTCC 6a and a SAW filter 1 as a receiving SAW filter 31 is encapsulated in a resin 2. The transmitting dielectric multilayer filter 33 and receiving SAW filter are formed adjacent to each other on top of the second LTCC 6a.

The first LTCC 3a and second LTCC 6a are made of low-dielectric-constant materials, like the first LTCC 3 and second LTCC 6 in the first embodiment.

In this way, the receiving SAW filter 31 and transmitting SAW filter 31 are disposed adjacent to each other and the matching circuits 32 are formed in the first LTCC 3a and second LTCC 6a to complete the antenna duplexer 24a as an integral structure.

Thus, the antenna duplexer 24a is reduced in size, like the first embodiment, and also in thickness. It has good electric properties, is resistant to impacts such as drop impacts, and has reliability and stability.

While the second embodiment has been described with respect to the matching circuits 32 formed inside the first LTCC 3a and second LTCC 6a, the second embodiment is not limited to this arrangement. Another arrangement may be possible in which the matching circuit 32 is formed in one of the first LTCC 3a and second LTCC 6a.

(Third Embodiment)

A third embodiment of the present invention will be described below.

Figure 10:
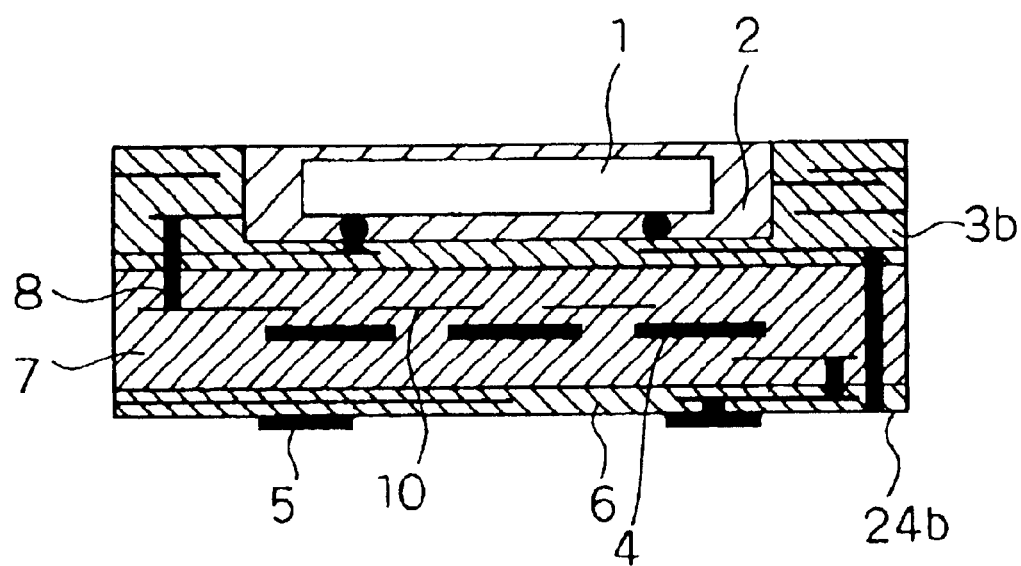
FIG. 10 is a cross-sectional view showing a structure of an antenna duplexer according to the third embodiment of the present invention.

FIG. 10 shows a cross-sectional view of an antenna duplexer 24b according to the third embodiment. The same elements as those in the first embodiment are labeled with the same reference numerals and the detailed description of which will be omitted.

In the antenna duplexer 24b shown in FIG. 10, a matching circuit 32 is formed in a first LTCC 3b having a cavity. A SAW filter 1 is encapsulated in a resin 2 in the cavity of the first LTCC 3b.

The first LTCC 3b is made of a low-dielectric constant material, like the first LTCC 3 in the first embodiment.

In the antenna duplexer 24b, the matching circuit 32 is formed in the first LTCC 3b and the SAW filter 1 is formed in its cavity. Because of this integral structure, the antenna duplexer 24b is reduced in size, like the first embodiment, and has good electric properties, is resistant to impacts such as drop impacts, and has reliability and stability.

While the third embodiment has been described with respect to the antenna duplexer 24b in FIG. 10 in which the first LTCC 3b having the cavity is formed on top of the third LTCC 7, the embodiment is not limited to this arrangement. Instead, the first LTCC 3b having the cavity may be formed under the third LTCC 7.

Figure 11:
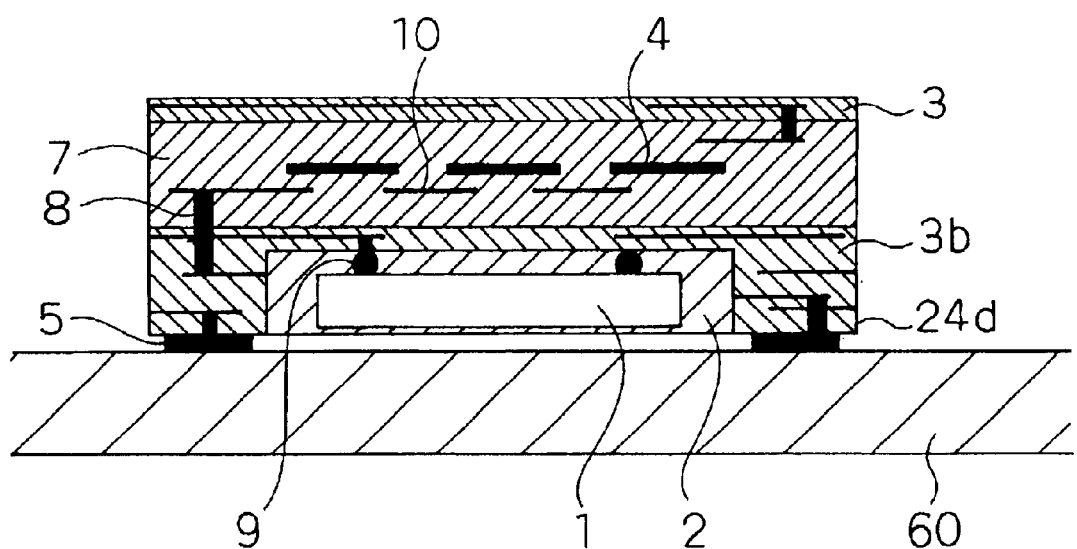
FIG. 11 is a cross sectional view showing a structure of a variation of the antenna duplexer of the third embodiment of the present invention.

FIG. 11 shows an antenna duplexer 24d in which a first LTCC 3b is formed under a third LTCC. In the antenna duplexer 24d shown in FIG. 11, a cavity is formed on the side of the LGA electrode 5, and a matching circuit 32 is formed in the first LTCC 3b having a cavity and a SAW filter 1 is encapsulated in a resin 2 in the cavity of the first LTCC 3b. Consequently, the cavity is formed near a substrate 60. This arrangement in which, unlike the third embodiment, the cavity is formed on the side of the LGA electrode 5, near the substrate 60, can also provide the similar effect to the third embodiment.

The receiving filter of the present invention is not limited to a filter having a surface acoustic wave device like the receiving SAW filters in the first to third embodiments. It may consist of a filter having a surface acoustic wave device and another filter having a dielectric resonator.

Figure 12:
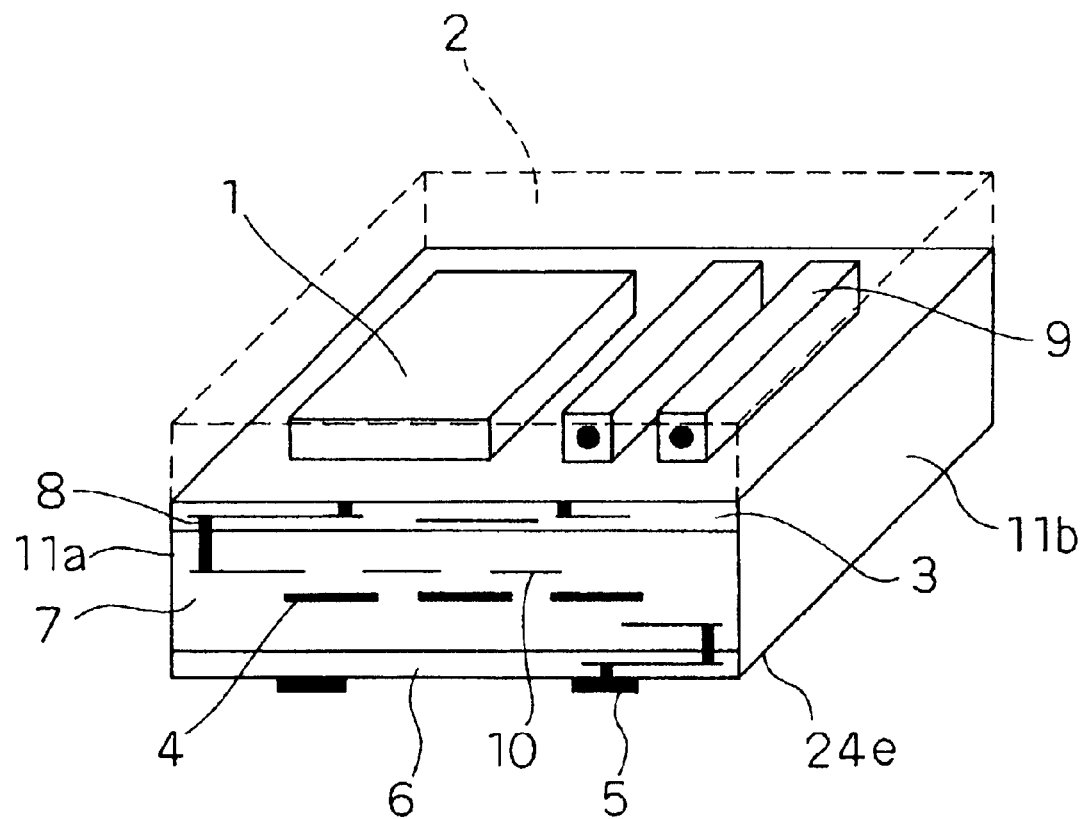
FIG. 12 shows a structure of an antenna duplexer of the embodiment of the present invention that has a receiving filter consisting of a SAW filter and a coaxial resonator.

FIG. 12 shows an antenna duplexer 24e whose receiving filter is a compound filter consisting of a filter having a surface acoustic wave device and a filter having a dielectric resonator. Unlike the antenna duplexer in the first embodiment described with reference to FIG. 3, a coaxial resonator 9 is used as a receiving filter, in addition to a SAW filter 1.

In a first LTCC (Low Temperature Co-fired Ceramic) 3 in FIG. 12, a matching circuit 32 as shown in FIG. 2 is formed by a combination of a lumped-constant inductor and capacitor. In place of the receiving SAW filter 31 in FIG. 2, the composite filter consisting of the SAW filter 1 and the coaxial resonator 9 is formed as a receiving filter on a top surface of the first LTCC 3. Both of the SAW filter 1 and coaxial resonator 9 are encapsulated in a resin 2. A third LTCC 7 is formed under the first LTCC 3 and a transmitting dielectric multilayer filter 33 as shown in FIG. 2 is formed by a multilayer structure. Formed inside the multilayer structure of the third LTCC 7 are main components of a transmitting dielectric multilayer filter 33, such as stripline resonators 4 and internal conductors 10 forming capacitors. A second LTCC 6 is formed under the third LTCC 7 and an LGA (Land Grid Array) electrode 5 is formed under the second LTCC 6. Edge electrodes 11a and 11b are formed on the sides of the third LTCC 7.

The receiving filter having the composite structure consisting of the SAW filter 1 and the coaxial resonator 9 formed as shown in FIG. 12 provides increased flexibility in designing the receiving filter of the embodiment.

In a SAW filter, an attenuation pole can readily be formed near the pass band. However, it is difficult to form an attenuation pole in a point at some distance from the band pass. This shortcoming of attenuation pole designs of the SAW filter can be covered by forming an attenuation pole at the resonance frequency of a coaxial resonator, for example.

A filter having such a dielectric resonator as the coaxial resonator 9 can easily cause the impedance of its counterpart to be opened but a filter having a surface acoustic wave device cannot easily cause the impedance of its counterpart to be opened. Using the filter having such a dielectric resonator as the coaxial resonator 9 in addition to the filter having surface acoustic wave device as described above can cover the shortcoming of the phase design of the filter having the surface acoustic wave device.

Figure 13:
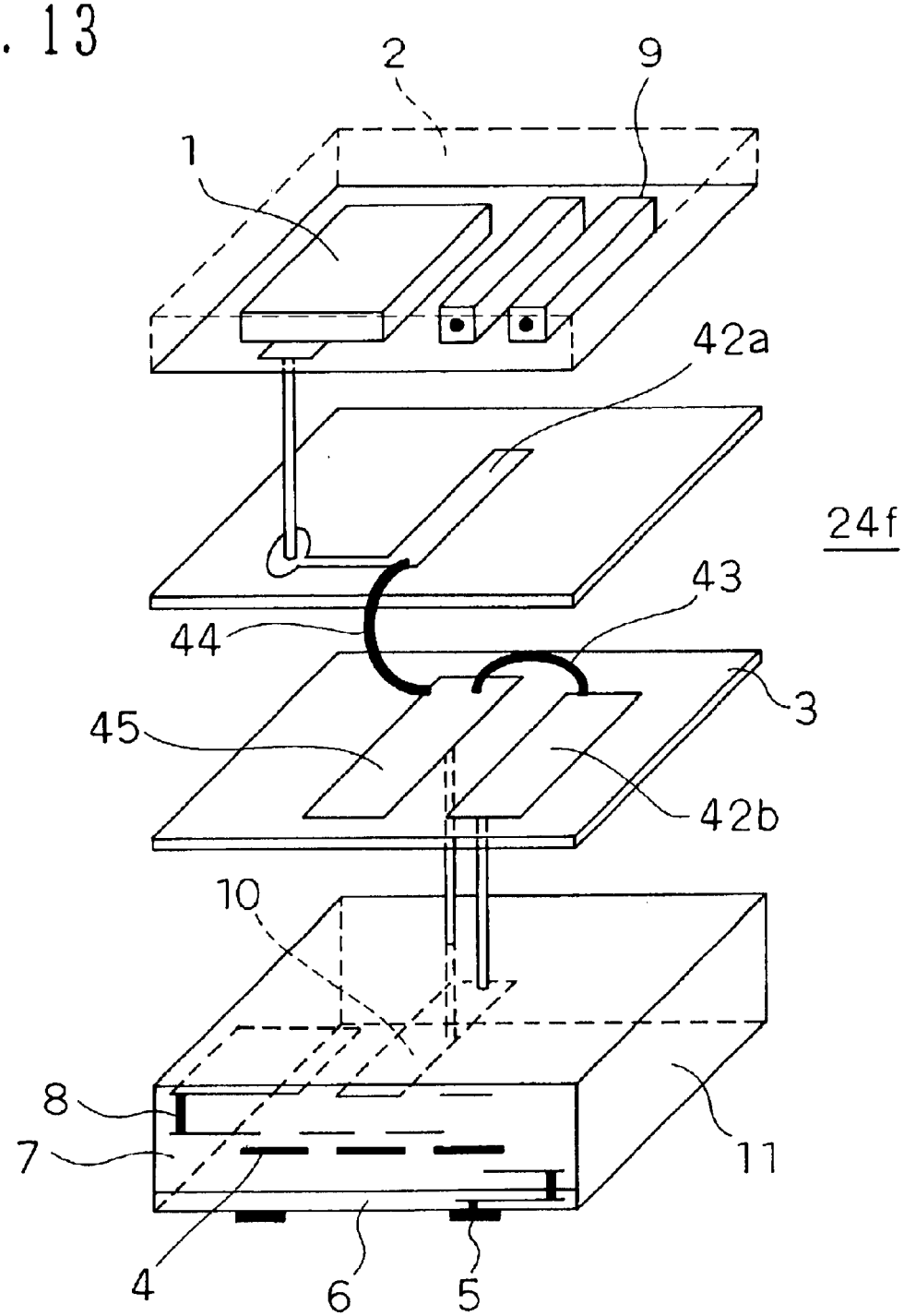
FIG. 13 is an exploded perspective view showing a configuration of an antenna duplexer using electromagnetic coupling according to the embodiment of the present invention.

In addition, the antenna duplexer according to the present invention is not limited to the above-described embodiments. Electromagnetic coupling may be used for an antenna duplexer as shown in FIG. 13. FIG. 13 is an exploded perspective view of a variation of the antenna duplexer of such an embodiment. The same elements as the above-described embodiments are labeled with the same reference numerals and the detailed description of which will be omitted.

The antenna duplexer 24f shown in FIG. 13 differs from the antenna duplexer 24e shown in FIG. 12 in the following ways. A matching circuit has striplines 42a and 42b. A receiving filter, which is a composite filter consisting of a SAW filter 1 and a coaxial resonator 9, is connected to the stripline 42a through a via. A transmitting filter formed in the third LTCC 7 is connected to the stripline 42b through a via. The stripline leading from the receiving filter and the stripline leading from the transmitting filter are electro-coupled with a phase lines 45 leading from the antenna, as indicated by electromagnetic couplings 43 and 44.

Broadly, there are two types of conventional configurations of matching circuits. In a first configuration, a stripline having a small line-width is routed a relatively long distance of approximately 5 to 20 mm. In a second configuration, an inductor L and a capacitor C are combined. The inductor L involves several to ten turns of a spiral stripline having a small line-width. Thus, these conventional striplines exhibit high transmission losses. On the contrary, the antenna duplexer 24f exhibits significantly lower loss because it is implemented by using the electromagnetic couplings 43 and 44 as indicated by the antenna duplexer 24f in FIG. 13.

Thus, the electromagnetic couplings 43 and 44 provide significant loss reduction in addition to effects equivalent to those of the above-described embodiments.

Figure 14:
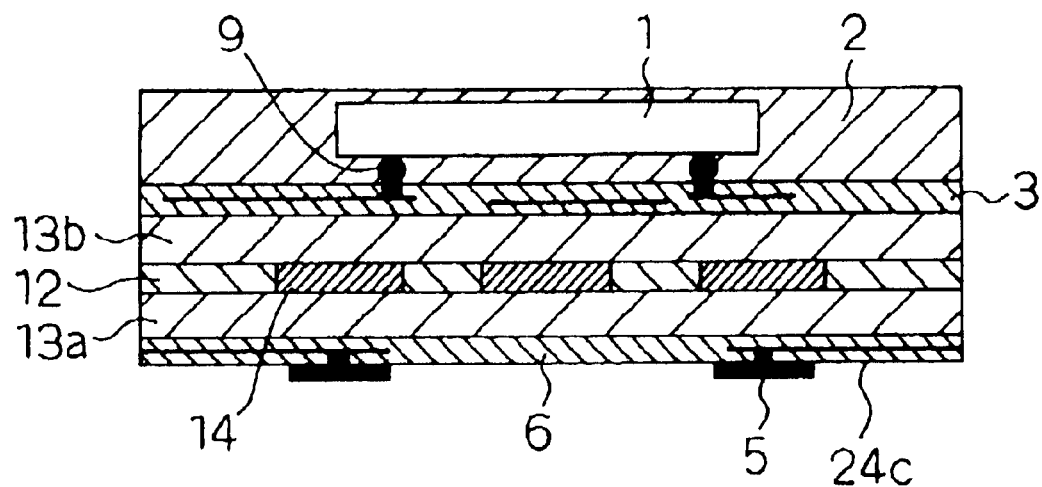
FIG. 14 is a cross-sectional view showing a configuration of an antenna duplexer having a stripline resonator made of metal foil according to the embodiment of the present invention.
Figure 15:
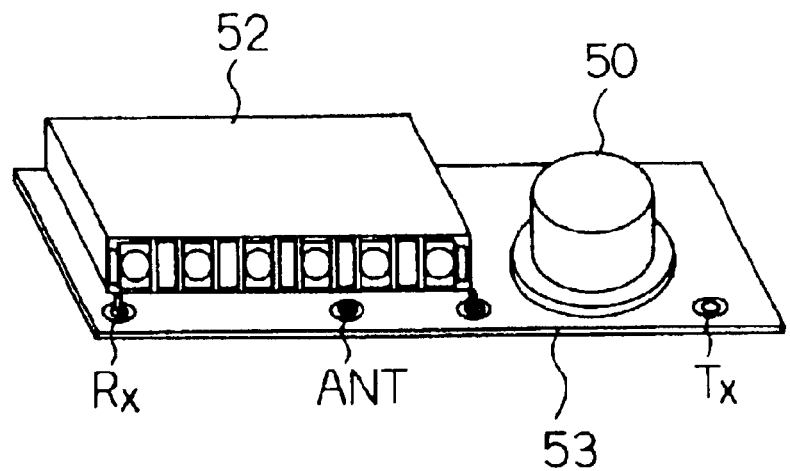
FIG. 15 shows a general view of an antenna duplexer according to prior art.
Figure 16:
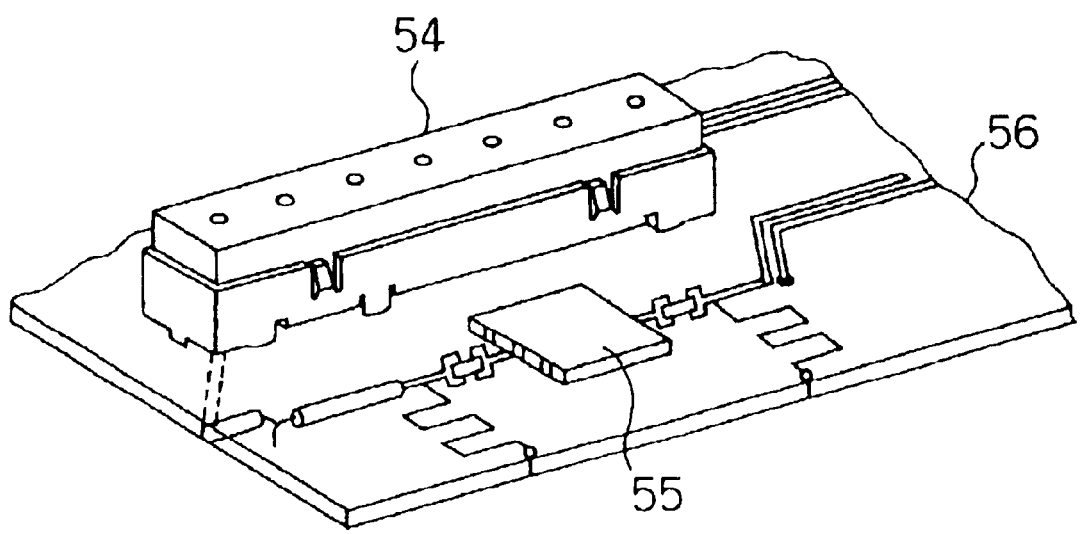
FIG. 16 schematically shows a general view of another antenna duplexer according to the prior art.

Metal foil may be used to form the stripline resonators of the antenna duplexers in the above-described embodiments. FIG. 14 shows a cross-sectional view of an antenna duplexer 24c in which metal foil resonators are used. The same elements as those in the first embodiment are labeled with the same reference numerals and the detailed description of which will be omitted.

Stripline resonators 14 are formed of metal foil, unlike those in the first embodiment. HTC (High Temperature Ceramic) layers 13a and 13b are made of a high temperature ceramic that has a firing temperature of 1300 degrees Celsius or higher, for example, and cannot be co-fired with silver or copper, but exhibits a lower loss than LTCCs. The stripline resonator 14, which is metal foil, is sandwiched between the HTC layers 13a and 13b. Gaps in the layer in which the stripline resonators 14 are formed are filled with a resin 12.

FIG. 6C shows materials that may form the HTC layers 13a and 13b. The HTC layers 13a and 13b may be formed by $ZrO_2$—$TiO_2$—$MgO$—$Nb_2O_s$ (having a relative dielectric constant of 43), $BaO$—$TiO_2$—$Nd_2O_3$ (having a relative dielectric constant of 90), or $BaO$—$TiO_2$—$Sm_2O_3$ (having a relative dielectric constant between 70 and 80).

Using metal foil for the stripline resonators 14 and any of these high temperature ceramics for the HTCs 14a and 14b to which this metal foil is inserted can further decrease loss and increase attenuation in the transmitting dielectric multilayer filter 33. Like this the metal foil can be used as the stripline resonator 14.

LTCCs described with respect to the first embodiment may be used in place of the HTCs 13a and 13b of this embodiment.

The transmitting filter of the present invention is not limited to the transmitting dielectric multilayer filter 33 of the present embodiment. It may be a dielectric coaxial filter. The transmitting filter of the present invention may be any dielectric filter that can be integrated as a unit with a receiving filter and a matching circuit.

The receiving surface acoustic wave filter 31 in the embodiments is an example of the receiving filter of the present invention and the transmitting dielectric multilayer filter 33 in the embodiments is an example of the transmitting filter of the present invention.

The multilayer structure herein is not limited to one in which layers are stacked vertically. The present invention includes a multilayer structure in which layers are disposed side by side laterally or longitudinally, or at an angle with each other, as appropriate for the mounting position of the antenna duplexer. The present invention also includes a multilayer structure in which layers are disposed side by side laterally or longitudinally, or at an angle with each other as appropriate for a method for manufacturing the multilayer structure.

As apparent from the above description, the present invention provides an antenna duplexer and communication apparatus that have a reduced size as well as good antenna duplexer electric properties.

Furthermore, the present invention provides an antenna duplexer and a communication apparatus that have improved reliability and stability as well as good antenna duplexer electric properties.

What is claimed is:

1. An antenna duplexer comprising:
   a receiving filter having a surface acoustic wave device;
   a transmitting filter having a dielectric mulitilayer filter; and
   a matching circuit for matching said receiving filter and said transmitting filter with an antenna respectively,
   wherein said transmitting filter, receiving filter, and matching circuit are integrated with each other, and
   said matching circuit has a dielectric multilayer structure.

2. A communication apparatus comprising:
   an antenna duplexer according to claim 1;
   a transmitter circuit for outputting a transmit wave to said transmitting filter; and
   a receiver circuit for inputting a receive signal provided from said receiving filter.

3. The antenna duplexer according to claim 1, wherein said transmitting filter and said matching circuit are integrated as a dielectric multilayer structure.

4. The antenna duplexer according to claim 1, wherein a dielectric constant of a dielectric material farming said transmitting filter is different from a dielectric constant of a dielectric material forming said matching circuit.

5. The antenna duplexer according to claim 4, wherein the dielectric constant of the dielectric material forming said transmitting filter is higher than the dielectric constant of the dielectric material forming said matching circuit.

6. The antenna duplexer according to claim 5, wherein a relative dielectric constant of the dielectric material forming said transmitting filter is equal to or higher than 10.

7. The antenna duplexer according to claim 5, wherein the relative dielectric constant of the dielectric material forming said matching circuit is less than 10.

8. The antenna duplexer according to claim 1, comprising a layer formed of the same material as the dielectric material forming said matching circuit,
   wherein said transmitting filter is sandwiched between said matching circuit and said layer to form one integrated muitilayer structure.

9. The antenna duplexer according to claim 8, wherein said receiving filter is formed on top of or under said matching circuit and encapsulated in a resin, and said receiving filter is electrically connected with said matching circuit.

10. The antenna duplexer according to claim 8, wherein said matching circuit is formed on top of or under said transmitting filter, and said receiving filter is electrically connected with said matching circuit.

11. The antenna duplexer according to claim 10, wherein said matching circuit is formed on a side on which said receiving filter is formed, and said receiving filter is electrically connected with said matching circuit.

12. The antenna duplexer according to claim 8, wherein said receiving filter is formed adjacent to said transmitting filter in said matching circuit and encapsulated in a resin, and the receiving filter and the transmitting filter are electrically connected with the matching circuit, respectively.

13. The antenna duplexer according to claim 8, wherein said receiving filter is formed in said matching circuit and encapsulated in a resin.

14. The antenna duplexer according to claim 1, wherein said transmitting filter and said matching circuit are connected through an edge electrode and/or a via electrode.

15. An antenna duplexer comprising:
   a receiving filter having a surface acoustic wave device;
   a transmitting filter having a dielectric multilayer filter; and
   a matching circuit for matching said receiving filter and said transmitting filter with an antenna respectively,
   wherein said transmitting filter, receiving filter, and matching circuit are integrated with each other, and
   said matching circuit has a first stripline; and
   said receiving filter is connected to said first stripline through a via and is connected only through a dielectric by electromagnetic coupling to a second stripline leading from said antenna, and
   said dielectric separates said first and second striplines.

16. An antenna duplexer comprising:
   a receiving filter having a surface acoustic wave device;
   a transmitting filter having a dielectric multilayer filter; and a matching circuit for matching said receiving filter and said transmitting filter with an antenna respectively, wherein said transmitting filter, receiving filter, and matching circuit are integrated with each other, and said matching circuit has a first stripline; and said transmitting filter is connected to said first stripline through a via and is connected only through a electromagnetic coupling to second stripline leading from said antenna, and said dielectric separates said first and second striplines.

17. An antenna duplexer comprising:

a receiving filter having a composite structure of a filter having a surface acoustic wave device and a filter having a dielectric coaxial resonator;

a transmitting filter having a filter with a dielectric multilayer filter; and a matching circuit for matching said receiving filter and said transmitting filter with an antenna, wherein said receiving filter, transmitting filter, and matching filter are integrated with each other, and said matching circuit has a dielectric multilayer structure.

18. A communication apparatus comprising:

an antenna duplexer according to claim 17;

a transmitter circuit for outputting a transmit wave to said transmitting filter; and a receiver circuit for inputting a receive signal provided from said receiving filter.

19. An antenna duplexer comprising:

a receiving filter having a surface acoustic wave device;

a transmitting filter having a dielectric multilayer filter; and a matching circuit for matching said receiving filter and said transmitting filter with an antenna respectively, wherein said transmitting filter, receiving filter, and matching circuit are integrated with each other, and said transmitting filter and said matching circuit are integrated as a dielectric multilayer structure, and a dielectric constant of a dielectric material forming said transmitting filter is different from a dielectric constant of a dielectric material forming said matching circuit.

20. The antenna duplexer according to claim 19, wherein the dielectric constant of the dielectric material forming said transmitting filter is higher than the dielectric constant of the dielectric material forming said matching circuit.

21. The antenna duplexer according to claim 20, wherein the relative dielectric constant of the dielectric material forming said matching circuit is less than 10.

22. The antenna duplexer according to claim 20, wherein a relative dielectric constant of the dielectric material forming said transmitting filter is equal to or higher than 10.

23. An antenna duplexer comprising:

a receiving filter having a surface acoustic wave device;

a transmitting filter having a dielectric multilayer filter; and a matching circuit for matching said receiving filter and said transmitting filter with an antenna respectively, wherein said transmitting filter, receiving filter, and matching circuit are integrated with each other, said transmitting filter and said matching circuit are integrated as a dielectric multilayer structure, a layer is formed of the same material as the dielectric material forming said matching circuit, and said transmitting filter is sandwiched between said matching circuit and said layer to form one integrated multilayer structure.

24. The antenna duplexer according to claim 23, wherein said receiving filter is formed in said matching circuit and encapsulated in a resin.

25. The antenna duplexer according to claim 23, wherein said receiving filter is formed on top of or under said matching circuit and encapsulated in a resin, and said receiving filter is electrically connected with said matching circuit.

26. The antenna duplexer according to claim 23, wherein said matching circuit is formed on top of or under said transmitting filter, and said receiving filter is electrically connected with said matching circuit.

27. The antenna duplexer according to claim 26, wherein said matching circuit is formed on a side on which said receiving filter is formed, and said receiving filter is electrically connected with said matching circuit.

28. The antenna duplexer according to claim 23, wherein said receiving filter is formed adjacent to said transmitting filter in said matching circuit and encapsulated in a resin, and the receiving filter and the transmitting filter are electrically connected with the matching circuit, respectively.

* * * * *

UNITED STATES PATENT AND TRADEMARK OFFICE
CERTIFICATE OF CORRECTION

PATENT NO. : 6,784,759 B2
DATED : August 31, 2004
INVENTOR(S) : Tomoya Maekawa et al.

It is certified that error appears in the above-identified patent and that said Letters Patent is hereby corrected as shown below:

Column 14,
Line 5, "farming" should read -- forming --.

Column 15,
Line 7, between "a" and "electro-", insert -- dielectric by --.
Line 8, between "to" and "second", insert -- a --.

Signed and Sealed this

Twelfth Day of April, 2005

JON W. DUDAS
*Director of the United States Patent and Trademark Office*